(12) United States Patent
Kinjo et al.

(10) Patent No.: US 12,389,749 B2
(45) Date of Patent: Aug. 12, 2025

(54) DISPLAY DEVICE INCLUDING PARTITION WALL

(71) Applicant: Japan Display Inc., Tokyo (JP)

(72) Inventors: Hiroumi Kinjo, Tokyo (JP); Hayata Aoki, Tokyo (JP); Masumi Nishimura, Tokyo (JP)

(73) Assignee: Japan Display Inc., Tokyo (JP)

( * ) Notice: Subject to any disclaimer, the term of this patent is extended or adjusted under 35 U.S.C. 154(b) by 677 days.

(21) Appl. No.: 17/661,417

(22) Filed: Apr. 29, 2022

(65) Prior Publication Data

US 2022/0367834 A1  Nov. 17, 2022

(30) Foreign Application Priority Data

May 14, 2021  (JP) ................................ 2021-082370

(51) Int. Cl.
| | |
|---|---|
| *H10K 59/12* | (2023.01) |
| *H10K 50/84* | (2023.01) |
| *H10K 50/844* | (2023.01) |
| *H10K 59/122* | (2023.01) |
| *H10K 59/35* | (2023.01) |
| *H10K 50/15* | (2023.01) |
| *H10K 50/16* | (2023.01) |
| *H10K 50/17* | (2023.01) |

(52) U.S. Cl.
CPC ......... *H10K 59/122* (2023.02); *H10K 50/844* (2023.02); *H10K 59/353* (2023.02); *H10K 50/15* (2023.02); *H10K 50/16* (2023.02); *H10K 50/17* (2023.02); *H10K 50/171* (2023.02); *H10K 59/12* (2023.02)

(58) Field of Classification Search
CPC ...... H10K 50/844; H10K 50/15; H10K 50/16; H10K 50/17; H10K 50/171; H10K 59/353; H10K 59/122; H10K 59/12
See application file for complete search history.

(56) References Cited

U.S. PATENT DOCUMENTS

| | | | | |
|---|---|---|---|---|
| 7,753,751 | B2* | 7/2010 | Yamazaki | ............ H10K 59/123 313/506 |
| 2009/0009069 | A1* | 1/2009 | Takata | .................. H10K 50/824 445/24 |
| 2014/0103368 | A1* | 4/2014 | Hatano | ................. H10K 59/122 257/88 |
| 2016/0118451 | A1* | 4/2016 | Youn | ................... H10D 30/6704 257/66 |

(Continued)

FOREIGN PATENT DOCUMENTS

| | | | | |
|---|---|---|---|---|
| CN | 112242420 A | * | 1/2021 | ........... G06F 3/0412 |
| JP | 2000-195677 A | | 7/2000 | |

(Continued)

*Primary Examiner* — Ida M Soward
(74) *Attorney, Agent, or Firm* — Maier & Maier, PLLC

(57) ABSTRACT

A display device includes a base, display elements, a partition wall, first to third inorganic layers and a resin layer. The display element includes first and second electrodes and a light-emitting layer between the electrodes. The partition wall is located between adjacent pair of the display elements. The first inorganic layer covers the display elements and the partition wall. The second inorganic layer covers the first inorganic layer. The resin layer covers the second inorganic layer. The third inorganic layer covers the resin layer.

20 Claims, 9 Drawing Sheets

(56) References Cited

U.S. PATENT DOCUMENTS

| | | | |
|---|---|---|---|
| 2018/0090549 A1* | 3/2018 | Hamada | H10K 59/38 |
| 2018/0190731 A1* | 7/2018 | Park | G09G 3/20 |
| 2019/0198816 A1* | 6/2019 | Park | G02B 5/284 |
| 2020/0168823 A1* | 5/2020 | Kim | H10K 59/122 |
| 2020/0208259 A1* | 7/2020 | Shin | C23C 16/042 |
| 2020/0212140 A1* | 7/2020 | Huh | H01L 33/56 |
| 2020/0313102 A1* | 10/2020 | Kim | H10K 59/8731 |
| 2021/0028256 A1* | 1/2021 | Sonoda | H05B 33/12 |
| 2021/0066419 A1* | 3/2021 | Byun | H10K 59/8731 |

FOREIGN PATENT DOCUMENTS

| | | | | |
|---|---|---|---|---|
| JP | 2008-135325 A | | 6/2008 | |
| KR | 20200060594 A | * | 6/2020 | H10K 50/844 |
| WO | WO-2020008583 A1 | * | 1/2020 | H05B 33/10 |

* cited by examiner

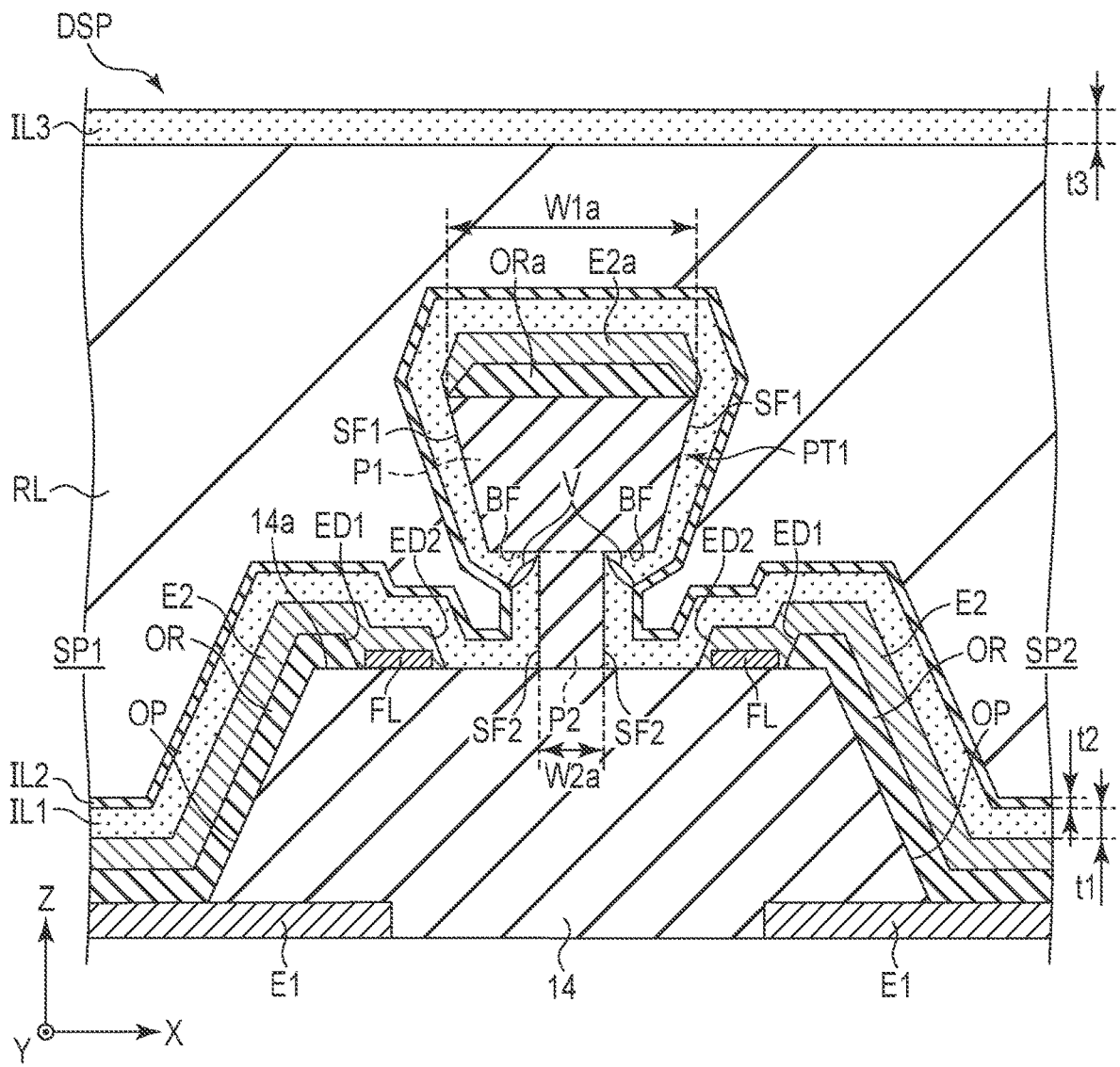
F I G. 5

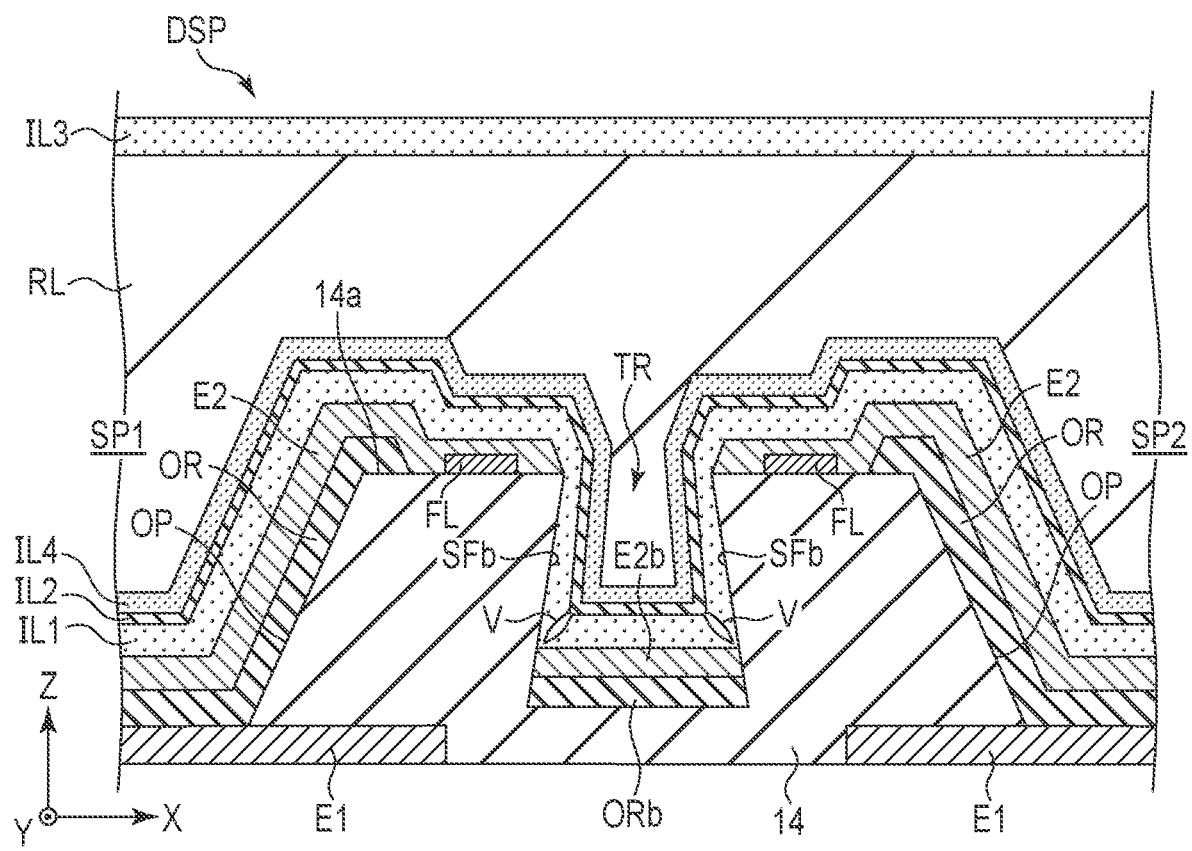
F I G. 15

DISPLAY DEVICE INCLUDING PARTITION WALL

CROSS-REFERENCE TO RELATED APPLICATIONS

This application is based upon and claims the benefit of priority from Japanese Patent Application No. 2021-082370, filed May 14, 2021, the entire contents of which are incorporated herein by reference.

FIELD

Embodiments described herein relate generally to a display device.

BACKGROUND

Recently, display devices in which organic light-emitting diodes (OLEDs) are applied as display elements have been put to practical use. Such display devices include a first electrode, a second electrode and an organic layer disposed between these electrodes. The organic layer includes a light-emitting layer which emits light in response to a voltage between the first electrode and the second electrode.

Generally, organic layers have low resistance to moisture. Therefore, if moisture reaches the organic layer for some reason, it can be a factor which causes degradation in display quality, such as a decrease in the luminance of the display element when emitting light.

BRIEF DESCRIPTION OF THE DRAWINGS

FIG. 5 is an enlarged cross-sectional view schematically showing a vicinity of a partition wall in FIG. 3.

FIG. 15 is a cross-sectional view schematically showing another example that can be applied to the display device of the third embodiment.

DETAILED DESCRIPTION

Figure 1:
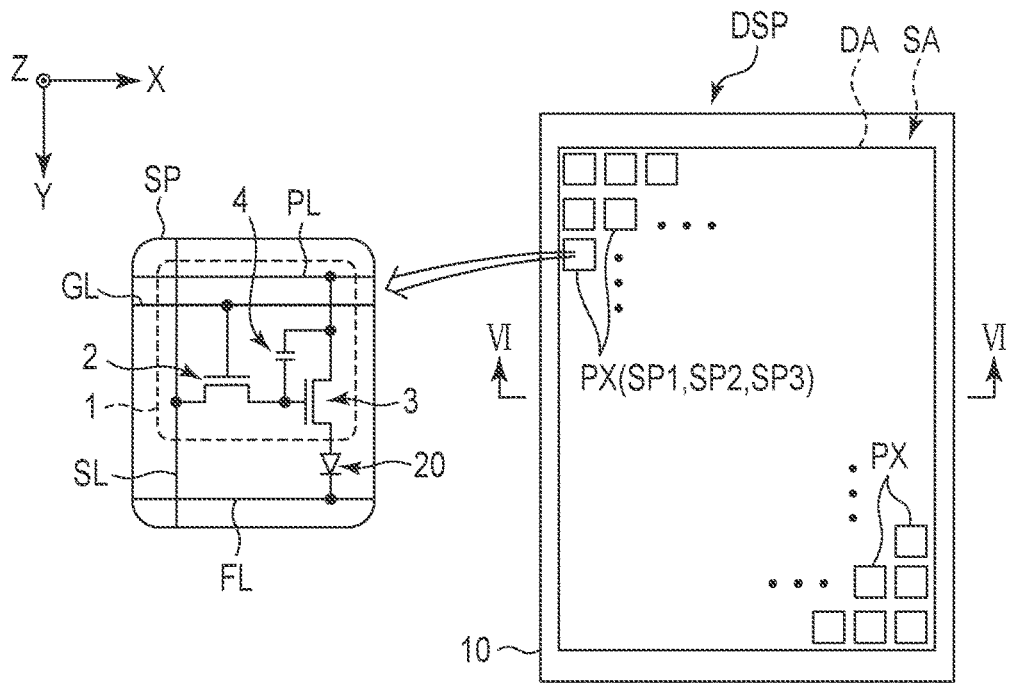
FIG. 1 is a diagram showing a configuration example of a display device according to the first embodiment.

In general, according to one embodiment, a display device comprises a base, display elements, a partition wall, a first inorganic layer, a second inorganic layer, a resin layer and a third inorganic layer. The display elements are disposed above the base, and each of the display elements includes a first electrode, a second electrode opposing the first electrode and a light-emitting layer located between the first electrode and the second electrode. The partition wall is located between adjacent pair of the display elements. The first inorganic layer is formed of an inorganic material, and covers the display elements and the partition wall. The second inorganic layer is formed of an inorganic material, and covers the first inorganic layer. The resin layer is formed of a resin, and covers the second inorganic layer. The third inorganic layer is formed of an inorganic material, and covers the resin layer.

According to another embodiment, a display device comprises a base, display elements, a partition wall, a first inorganic layer, a second inorganic layer, a resin layer and a third inorganic layer. The display elements are disposed above the base, and each of the display elements comprises a first electrode, a second electrode opposing the first electrode and a light-emitting layer located between the first electrode and the second electrode. The rib includes a trench located between adjacent pair of the display elements. The first inorganic layer is formed of an inorganic material, and covers the display element and an inner surface of the trench. The second inorganic layer is formed of an inorganic material, and covers the first inorganic layer. The resin layer is formed of a resin, and covers the second inorganic layer. The third inorganic layer formed of an inorganic material, and covers the resin layer.

According to such configurations, it is possible to provide a display device which can improve image quality.

Embodiments will be described hereinafter with reference to the accompanying drawings.

Note that the disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the same or similar elements as or to those described in connection with preceding drawings or those exhibiting similar functions are denoted by like reference numerals, and a detailed description thereof is omitted unless otherwise necessary.

Note that, in order to make the descriptions more easily understandable, some of the drawings illustrate an X axis, a Y axis and a Z axis orthogonal to each other. A direction along the X axis is referred to as a first direction, a direction along the Y axis is referred to as a second direction and a direction along the Z axis is referred to as a third direction. A plane defined by the X axis and the Y axis is referred to as an X-Y plane, and a plane defined by the X axis and the Z axis is referred to as an X-Z plane.

Further, viewing towards the X-Y plane is referred to as plan view.

The display device DSP according to these embodiments is an organic electroluminescent display device comprising an organic light-emitting diode (OLED) as a display element, and it can be installed in televisions, personal computers, in-vehicle equipment, tablet terminals, smart phones, cell phone terminals and the like.

First Embodiment

FIG. 1 is a diagram showing an example of a display device DSP according to the first embodiment. The display device DSP comprises a display area DA which displays images and a peripheral area SA surrounding the display area DA, on an insulating base 10. The base 10 may be glass or a flexible resin film.

In this embodiment, the shape of the base 10 in plan view is rectangular. Note that the plan-view shape of the base 10 is not limited to a rectangle, but may be other shapes such as a square, circle and oval.

The display area DA comprises a plurality of pixels PX arranged in a matrix along the first direction X and the second direction Y. The pixels PX each comprises a plurality of sub-pixels SP. For example, a pixel PX comprises a red sub-pixel SP1, a green sub-pixel SP2 and a blue sub-pixel SP3. Note that each pixel PX may comprise four or more sub-pixels in addition to the above-mentioned three-color sub-pixels, the additional pixels being, for example, of some other color such as white.

The sub-pixels SP each comprise a pixel circuit 1 and a display element 20 driven by the pixel circuit 1. The pixel circuit 1 comprises a pixel switch 2, a drive transistor 3 and a capacitor 4. The pixel switch 2 and the drive transistor 3 are switching elements constituted by thin-film transistors, for example.

In the pixel switch 2, the gate electrode is connected to a scanning line GL. One of a source electrode and a drain electrode of the pixel switch 2 is connected to a signal line SL, and the other is connected to a gate electrode of the drive transistor 3 and the capacitor 4. In the drive transistor 3, one of a source electrode and a drain electrode is connected to a power line PL and the capacitor 4, and the other is connected to an anode of the display element 2. The display element 20 is an organic light-emitting diode (OLED) as a light-emitting element. A cathode of the display element 20 is connected to a power supply line FL, to which a common voltage is applied. Note that the configuration of the pixel circuit 1 is not limited to that of the example shown in the figure.

Figure 2:
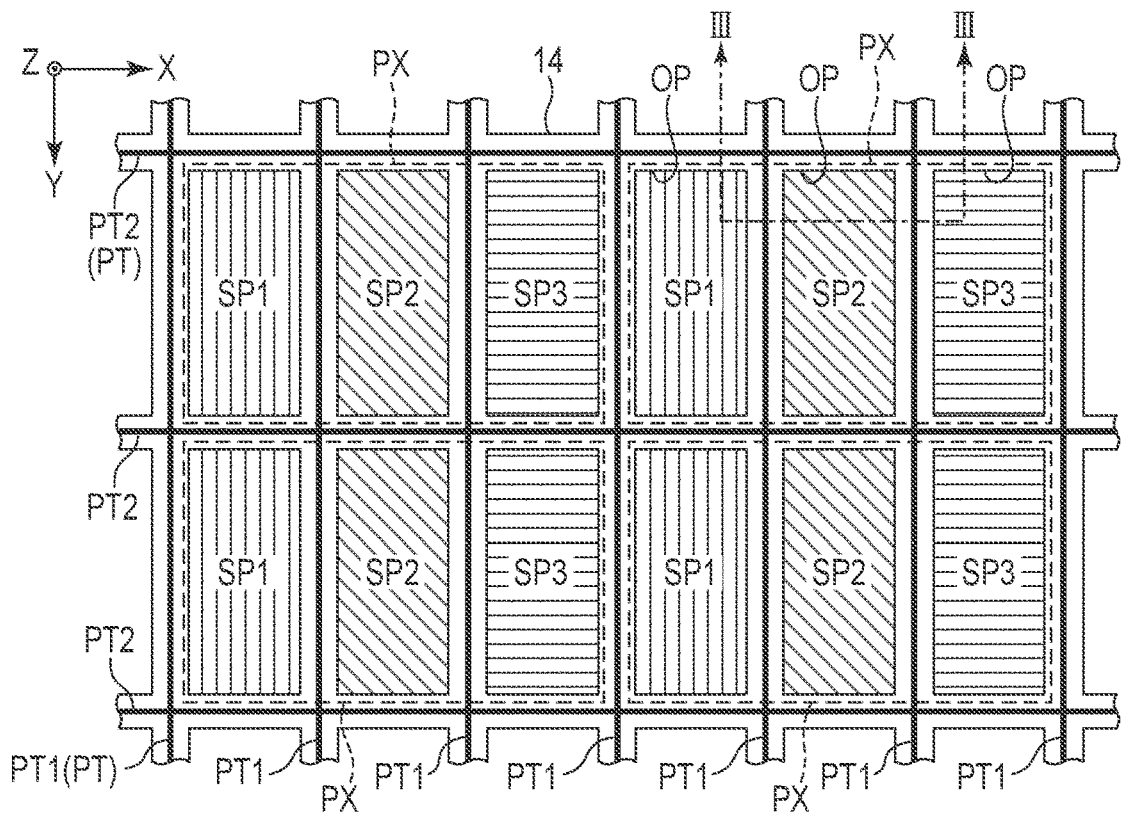
FIG. 2 is a diagram showing an example of a layout of sub-pixels in the first embodiment.

FIG. 2 is a diagram showing an example of a layout of the sub-pixels SP (SP1, SP2 and SP3). Here, let us focus on four pixels PX. In each pixel PX, the sub-pixels SP1, SP2 and SP3 are aligned in this order along the first direction X. That is, in the display area DA, columns each constituted by a plurality of sub-pixels SP1 aligned along the second direction Y, columns each constituted by a plurality of sub-pixels SP2 aligned along the second direction Y, and columns each constituted by a plurality of sub-pixels SP3 are arranged alternately along the first direction X.

In boundaries between the sub-pixels SP1, SP2 and SP3, ribs 14 are respectively provided. In the example shown in FIG. 2, the ribs 14 are formed into a lattice-shape including portions each provided between each pair of sub-pixels SP adjacent to each other along the first direction X and portions each provided between each pair of sub-pixels SP adjacent to each other along the second direction Y. The ribs 14 include openings OP formed in the sub-pixels SP1, SP2 and SP3, respectively.

On the ribs 14, a plurality of partition walls PT are disposed respectively. In the example of FIG. 2, the partition walls PT include a plurality of partition walls PT1 parallel to the second direction Y and a plurality of partition walls PT2 parallel to the first direction X.

The partition walls PT1 are respectively located between sub-pixels SP1 and SP2 adjacent to each other along the first direction X, between sub-pixels SP2 and SP3 adjacent to each other along the first direction X, and between sub-pixels SP1 and SP3 adjacent to each other along the first direction X. In other words, the partition walls PT1 are located at the respective boundaries between sub-pixels SP of different colors.

The partition walls PT2 are each located between each respective pair of sub-pixels SP1 adjacent to each other along the second direction Y, between each respective pair of sub-pixels SP2 adjacent to each other along the second direction Y and between each respective pair of sub-pixels SP3 adjacent to each other along the second direction Y. In other words, the partition walls PT2 are located at the respective boundaries between sub-pixels SP of the same color. Note here that color mixing does not occurs between sub-pixels SP of the same color, and therefore the partition walls PT2 may be omitted.

Figure 3:
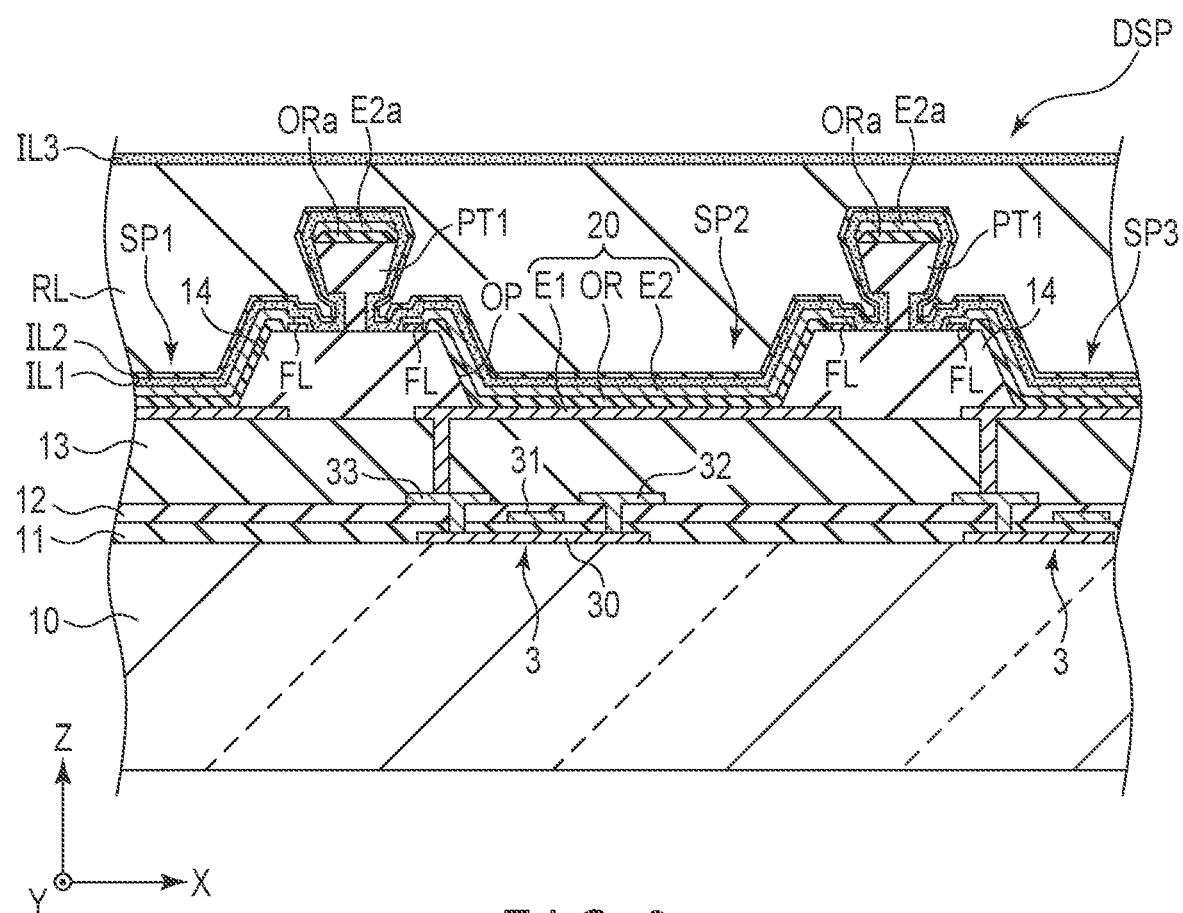
FIG. 3 is a cross-sectional view schematically showing the display device taken along line in FIG. 2.

FIG. 3 is a cross-sectional view schematically showing the display device DSP taken along line III-III in FIG. 2. Note that the FIG. 3 mainly shows the cross-sectional structure of the sub-pixel SP2, but the sub-pixels SP1 and SP3 have a cross-sectional structure similar to that of the sub-pixel P2. Further, the drive transistor 3 and the display element 20 are shown as elements disposed in one sub-pixel SP2, and other elements are omitted from the illustration.

The display device DSP further comprises insulating layers 11, 12 and 13, a first inorganic layer IL1, a second inorganic layer IL2, a third inorganic layer IL3 and a resin layer RL in addition to the base 10, the ribs 14, the partition walls PT1 and the power supply lines FL.

The insulating layers 11, 12 and 13 are stacked along the third direction Z on the base 10. The insulating layers 11 and 12 are each formed, for example, of an inorganic material. The insulating layer 13 is formed, for example, of an organic material.

The drive transistor 3 comprises a semiconductor layer 30 and electrodes 31, 32 and 33. The electrode 31 is equivalent to a gate electrode. One of the electrodes 32 and 33 is equivalent to a source electrode and the other is equivalent to a drain electrode. The semiconductor layer 30 is disposed between the base 10 and the insulating layer 11. The electrode 31 is disposed between the insulating layers 11 and 12. The electrodes 32 and 33 are disposed between insulating layers 12 and 13, and are in contact with the semiconductor layer 30 via contact holes that penetrate the insulating layers 11 and 12.

The display element 20 comprises a first electrode E1, an organic layer OR and a second electrode E2. The first electrode E1 is an electrode provided for each sub-pixel SP and may be referred to as a pixel electrode, a lower electrode or an anode. The second electrode E2 is an electrode commonly provided for multiple sub-pixels SP and may be referred to as a common electrode, an upper electrode or a cathode.

The ribs 14 are disposed on the insulating layer 13. The ribs 14 can be formed of an organic material. The first electrode E1 is disposed on the insulating layer 13 and overlaps the respective opening OP. The periphery of the first electrode E1 is covered by the respective rib 14. The first electrode E1 is electrically connected to the electrode 33 via a contact hole penetrating the insulating layer 13. The first electrode E1 is formed of a metal material. Note that the first electrode E1 may as well be made of a transparent conductive material such as indium tin oxide (ITO) or indium zinc oxide (IZO), or may be a stacked body of a transparent conductive material and a metal material.

The organic layer OR is in contact with the first electrode E1 via the respective opening OP. A part of the organic layer OR is located above the respective rib 14. The second electrode E2 covers the organic layer OR. The second electrode E2 is formed, for example, of a metal material. But, the second electrode E2 can be made of a transparent conductive material such as ITO, IZO or the like.

The partition walls PT1 are disposed above the ribs 14, respectively. The partition walls PT2 as well shown in FIG. 2 are disposed above the ribs 14, respectively. The partition walls PT1 and PT2 are formed of an organic material, for example.

The power supply lines FL are formed of a metal material and are disposed above the ribs 14, respectively. In the example of FIG. 3, two power supply lines FL are arranged above the respective rib 14, and the respective partition wall PT1 is placed between these power supply lines FL. The power supply lines FL pass under the partition walls PT2, respectively, shown in FIG. 2, for example, and extend along the second direction Y. The power supply lines FL may be located directly below the partition walls PT1, respectively. Or, there may be further power supply lines FL extending in the first direction X and disposed along the partition walls PT2, respectively.

The first inorganic layer IL covers the second electrodes E2, the ribs 14 and the partition walls PT1 and PT2. The second inorganic layer IL2 covers the first inorganic layer IL. The resin layer RL covers the second inorganic layer IL2. The resin layer RL is formed, for example, of an organic material (resin). The resin layer RL is thicker than the insulating layers 11, 12 and 13, the ribs 14, the first inorganic layer IL1, the second inorganic layer IL2, the third inorganic layer IL3 and the partition walls PT1 and PT2, so as to flatten the unevenness created by the ribs 14. The third inorganic layer IL3 covers the resin layer RL.

The first inorganic layer IL1, the second inorganic layer IL2 and the third inorganic layer IL3 are each made of, for example, an inorganic material such as silicon oxide (SiOx), silicon nitride (SiNx), silicon oxynitride (SiONx), a metal, a metal oxide or the like. From the view of the adherence between both, the first inorganic layer IL1 and the second inorganic layer IL2 should preferably be formed of the same inorganic material. For example, as in the case where one of the first inorganic layer IL1 and the second inorganic layer IL2 is made of silicon oxide and the other is silicon nitride, both the first inorganic layer IL1 and the second inorganic layer IL may be made of a silicon-based inorganic material. Further, the first inorganic layer IL1 and the second inorganic layer IL2 may be made of inorganic materials of the same system other than the silicon-based materials. Even in these cases, the adherence between the first inorganic layer IL1 and the second inorganic layer IL2 can be improved. Note that the third inorganic layer IL3 may as be formed of the same inorganic material as that of the first inorganic layer IL1 and the second inorganic layer IL2, or may be formed of inorganic materials of the same system, used for the first inorganic layer IL1 and the second inorganic layer IL2.

In this embodiment, as will be described below, the first inorganic layer IL1 and the second inorganic layer IL2 are formed by vapor deposition under different deposition conditions. Therefore, even if the first inorganic layer IL1 and the second inorganic layer IL2 are formed of the same material, the first inorganic layer IL1 and the second inorganic layer IL2 may be different from each other in film density and composition ratio. The first inorganic layer IL1, the second inorganic layer IL2, the resin layer RL and the third inorganic layer IL3 function as a sealing layer to protect the organic layer OR from moisture and the like.

Figure 4:
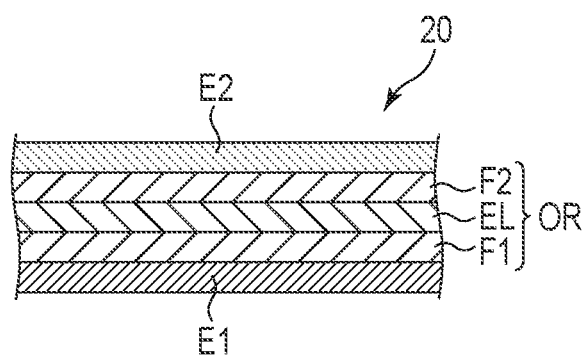
FIG. 4 is a cross-sectional view showing an example of a layer configuration that can be applied to an organic layer in the first embodiment.

FIG. 4 is a cross-sectional view showing an example of a layer configuration that can be applied to the organic layer OR. For example, the organic layer OR includes a first functional layer F1, a light-emitting layer EL and a second functional layer F2 sequentially stacked one on another from the first electrode E1 towards the second electrode E2.

When the potential of the first electrode E1 is relatively higher than that of the second electrode E2, the first electrode E1 is equivalent to the anode and the second electrode E2 is equivalent to the cathode. When the potential of the second electrode E2 is relatively higher than that of the first electrode E1, the second electrode E2 is equivalent to the anode and the first electrode E1 is equivalent to the cathode.

For example, when the first electrode E1 is equivalent to the anode, the first functional layer F1 includes at least one of a hole injection layer, a hole transport layer and an electron blocking layer and the second functional layer F2 includes at least one of an electron transport layer, an electron injection layer and a hole blocking layer.

When a potential difference is created between the first electrode E1 and the second electrode E2, the light emitting layer EL emits light. Note that this embodiment is based on the assumption that the light-emitting layers EL included in the organic layers OR of the respective sub-pixels SP1, SP2 and SP3 all emit light of the same color (for example, white). In this case, for example, color filters respectively corresponding to the colors of the sub-pixels SP1, SP2 and SP3 may be disposed above the resin layer RL. Alternatively, layers containing quantum dots that generate light of the colors respectively corresponding to the sub-pixels SP1, SP2 and SP3, when excited by the light emitted by the light-emitting layer EL are disposed in the sub-pixels SP1, SP3 and SP3. Note that the light-emitting layers EL of the sub-pixels SP1, SP2 and SP3 may be of types which emit respective colors of the sub-pixels SP1, SP2 and SP3.

FIG. 5 is an enlarged cross-sectional view schematically showing the vicinity of the partition wall PT1 located between the sub-pixels SP1 and SP2 in FIG. 3. The partition wall PT1 includes a first portion P1 and a second portion P2 located below the first portion P1. In the example shown in FIG. 5, the second portion P2 is in contact with an upper surface 14a of the rib 14.

The first portion P1 has a first width W1a. The second portion P2 has a second width W2a. The second width W2a is smaller than the first width W1a (W1a>W2a).

In the example of FIG. 5, a pair of side surfaces SF1 of the first portion P1 are inclined such that the distance between the side surfaces SF1 decreases from an upper end of the first portion P1 towards a lower end. In other words, the width of the first portion P1 is not constant along the third direction Z. The first width W1a is equivalent to the maximum width of the first portion P1, and in the illustrated example, it is the width of the upper edge of the first portion P1. Note that the pair of side surfaces SF1 may be parallel to the third direction Z. Further, the pair of side surfaces SF1 may be inclined such that the distance between the side surfaces SF1 increases from the upper end to the lower end of the first portion P1. In the example in FIG. 5, the pair of side surfaces SF2 of the second portion P2 are parallel to the third direction Z. Note that the pair of side surfaces SF2 may be inclined with respect to the third direction Z.

The first portion P1 includes a pair of lower surfaces BF which connect the side surfaces SF1 and the side surfaces SF2 respectively to each other. The lower surfaces BF oppose the upper surface 14a of the rib 14. The partition wall PT1, which includes the first portion P1 and the second portion P2, has such a shape which can be called, for example, an overhang shape. The shape of the partition wall PT1 is not limited to that of the example shown in FIG. 5. For example, the partition wall PT1 may have a shape that does not include a portion corresponding to the lower surface BF (a reverse tapered shape).

On the partition PT1 (the first portion P1), an organic layer ORa and a conductive layer E2a which covers the organic layer ORa are disposed. The organic layer ORa is formed of the same material as that of the organic layer OR. The conductive layer E2a is formed of the same material as that of the second electrode E2. The organic layer ORa is separated from the organic layer OR disposed between the sub-pixels SP1 and SP2. The conductive layer E2a is separated from the second electrode E2 between the sub-pixels SP1 and SP2.

The organic layer OR and the second electrode E2 are formed over the entire surface of the display area DA by vacuum evaporation, for example. At this time, the organic layer ORa and the conductive layer E2a are formed as the material from the evaporation source adheres on the upper surface of the partition PT1. On the other hand, the material from the deposition source does not easily adhere to the side surfaces SF1 and SF2. In this manner, the organic layer OR and the organic layer ORa are separated from each other, and the second electrode E2 and the conductive layer E2a are separated from each other.

The organic layer OR includes a first edge portion ED1 on the upper surface 14a of the rib 14. The second electrode E2 includes a second edge portion ED2 on the upper surface 14a. Both the first edge portion ED1 and the second edge portion ED2 are spaced apart from the second portion P2. The second edge portion ED2 is located between the first edge portion ED1 and the second portion P2 along in the first direction X. The first edge portion ED1 is covered by the second electrode E2.

The power supply line FL is located between the first edge portion ED1 and the second portion P2 in the upper surface 14a. The second electrode E2 is in contact with the power supply line FL. In the example in FIG. 5, the entirety of the power supply line FL is covered by the second electrode E2, and the second edge portion ED2 is located between the power supply line FL and the second portion P2. But, a part of the power supply line FL may not be covered by the second electrode E2.

The first inorganic layer IL1 continuously covers the second electrodes E2 of the sub-pixels SP1 and SP2, the upper surface 14a, the pair of side surfaces SF1, the pair of side surfaces SF2, the pair of lower surfaces BF and the conductive layers E2a. The second inorganic layer IL2 continuously covers the upper surface of the first inorganic layer IL1.

Note that FIG. 5 shows the configuration in the vicinity of the sub-pixels SP1 and SP2, and a similar configuration can be applied to the vicinity of the boundary between the sub-pixels SP2 and SP3 and also the vicinity of the boundary between the sub-pixels SP1 and SP3. To the partition wall PT2 shown in FIG. 2, a shape similar to the partition wall PT1 can be applied. The configuration shown in FIG. 5 can be applied to the cross-sectional configurations of the vicinity of the boundary between each respective pair of sub-pixels SP1 aligned along the second direction Y, the vicinity of the boundary between each respective pair of sub-pixels SP2 aligned along the second direction Y, and the vicinity of the boundary between each respective pair of sub-pixels SP3 aligned along the second direction Y, as well.

The first inorganic layer IL1 can be formed, for example, by vapor deposition such as chemical vapor deposition (CVD) after the second electrode E2 is formed. When the first inorganic layer IL1 is formed by vapor deposition, in the vicinity of a corner made by two surfaces that form a large angle, an inorganic layer grows from one of the surfaces, and further an inorganic layer grows from the other surface as well. When these inorganic layers are close to each other, gas flow into the area between these layers is inhibited to form crevasses-like voids (gaps) and seams. Into voids, the resin layer RL does not easily enter, and therefore the atmospheric air can remain in the voids.

In the example in FIG. 5, a void V is formed in the vicinity of the corner between the side surface SF2 and the lower surface BF. Instead of the void V, a seam may be formed in the vicinity of the corner between the side surface SF2 and the lower surface BF. Further, a void or seam may be formed in the vicinity of the proximal portion of the second portion P2.

Conventionally, as a sealing layer of the organic electroluminescent display device, a three-layer sealing structure is commonly used, a lower inorganic layer, a resin layer and an upper inorganic layer are stacked one on another in sequence. When such a three-layer sealing structure is applied to a display device including partition walls PT1 and PT2 such as of the present embodiment, and when a void or seam is created in the lower inorganic layer, it may not be possible to sufficiently suppress filtration of moisture into the display element. That is, if, for example, the resin layer contains moisture from the beginning, the moisture can reach the display element through voids or seams. Further, if cracks occur in the upper inorganic layer, moisture can enter the display element through the cracks, the resin layer, and the voids and seams in the lower inorganic layer, in the order. If moisture reaches the display element (especially, the organic layer OR), such a display error may be caused, as lowering of the luminance of the display element (the occurrence of dark spots).

By contrast, in this embodiment, the second inorganic layer IL2 is stacked on the first inorganic layer IL1. Therefore, even if voids or seams occur in the first inorganic layer IL1, these voids or seams are covered by the second inorganic layer IL2. Therefore, the moisture cannot easily enter the display element 20. Thus, it is possible to improve the display quality of the display device DSP.

The second inorganic layer IL2 is formed by vapor deposition as in the case of the first inorganic layer IL1. It is necessary for the second inorganic layer IL2 to continuously cover the portion of the first inorganic layer IL1, where voids and seams may occur. Therefore, it is preferable that the second inorganic layer IL2 be formed under deposition conditions by which wrap-in properties are better than those of the first inorganic layer IL1.

Excellent wrap-in properties can also be achieved by devising the structure of the vapor deposition apparatus. For example, the shape of the shower plate of the vapor deposition apparatus may be adjusted. More specifically, the multiple openings made in the shower plate used for the deposition of the second inorganic layer IL2 may be tapered in shape such that the diameter thereof increase as the location approaches the workpiece.

When a hollow-cathode deposition apparatus is used, the opening of the anode may be formed larger than the opening of the cathode, or the opening of the anode may be tapered in shape such that the diameter thereof increases as the location approaches the workpiece.

The first inorganic layer IL1 needs to be configured to excellently suppress the entering of moisture to the lower layers in each of the sub-pixel SP1, SP2 and SP3 and in the boundaries thereof, entirely, and therefore it needs have a certain degree of thickness. In contrast, the second inorganic layer IL2 needs to be densely formed at a slow growth rate to avoid voids and seams.

From the views provided above, in this embodiment, a thickness t1 of the first inorganic layer IL1 is greater than a thickness t2 of the second inorganic layer IL2. In other words, the second inorganic layer IL2 is formed thinner than the first inorganic layer IL1. A thickness t3 of the third inorganic layer IL3 is equivalent to, for example, the thickness t1. For example, the thickness t2 is ½ or less the thickness t1. The thickness t2 may be ¹⁄₁₀ or less the thickness t1.

The unevenness created in the vicinity of the corner of the side surface SF2 and the lower surface BF and the vicinity of the proximal portion of the second portion P2 is mitigated by the first inorganic layer IL1. Therefore, in the second inorganic layer IL2, voids and seams do not easily occur in the vicinities of the corners or the proximal portion.

Note that when the first inorganic layer IL1 and the second inorganic layer IL2 are formed in separate processes, a clear interface is formed between the first inorganic layer IL1 and the second inorganic layer IL2. On the other hand, the second insulating layer IL2 may as well be formed while gradually changing the deposition conditions from the final stage the process of forming the first inorganic layer IL1. In this case, the boundary between the first inorganic layer IL1 and the second inorganic layer IL2 is created to have gradation, and no clear interface is formed therebetween.

Here, an example of the advantageous effects of this embodiment based on the cross-section including the partition wall PT1 as shown in FIG. 5 has been described, but similar effects can be obtained in the vicinity of the partition wall PT2.

Figure 6:
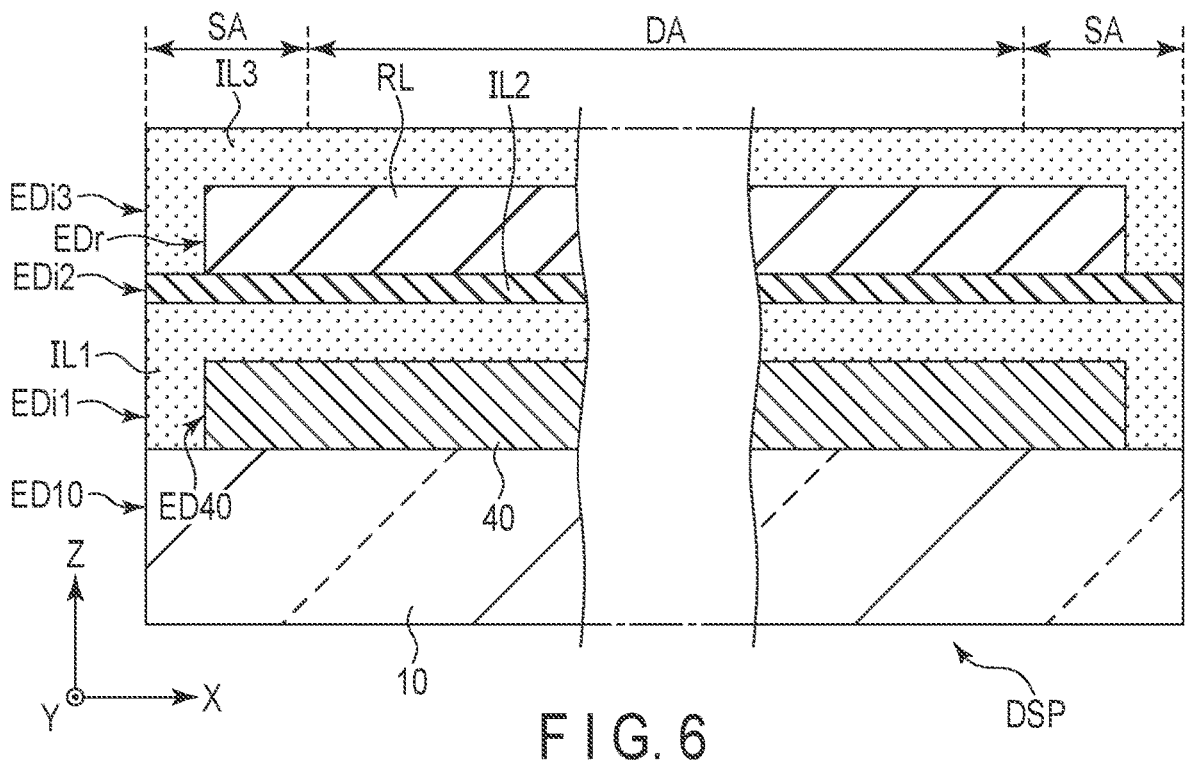
FIG. 6 is a cross-sectional view schematically showing the display device taken along line VI-VI in FIG. 1.

FIG. 6 is a cross-sectional view schematically showing the display device DSP taken along line VI-VI in FIG. 1. In this drawing, the elements disposed on the base 10, namely, the insulating layers 11, 12 and 13, the ribs 14, the partition walls PT1 and PT2, the pixel circuit 1, the display element 20 and the like are illustrated in a simplified manner as a circuit layer 40.

The circuit layer 40, the first inorganic layer IL1, the second inorganic layer IL2, the third inorganic layer IL3, and the resin layer RL are formed over the entirety of the display area DA and further they are formed to extend into the peripheral area SA. In other words, an edge portion ED40 of the circuit layer 40, an edge portion EDi1 of the first inorganic layer IL1, an edge portion EDi2 of the second inorganic layer IL2, an edge portion Edi3 of the third inorganic layer IL3 and an edge portion EDr of the resin layer RL are all located in the peripheral area SA.

In the example of FIG. 6, the edge portions EDi1, EDi2 and EDi3 and the edge portion ED10 of the base 10 are aligned with each other. On the other hand, the edge portions ED40 and EDr are located closer to the display area DA with respect to the edge portions EDi1, EDi2 and EDi3. The edge portion ED10 may protrude beyond the edge portions EDi1, EDi2 and EDi3. In other words, the edge portions EDi1, EDi2 and EDi3 may be located between the edge portion ED10 and the edge portions EDr and ED40 in the peripheral area SA.

The first inorganic layer IL1 is in contact with the base 10 in the peripheral area SA. The third inorganic layer IL3 is in contact with the second inorganic layer IL2 in the peripheral area SA. The edge portion ED40 of the circuit layer 40 is covered by the first inorganic layer IL1. The edge portion EDr of the resin layer RL is covered by the third inorganic layer IL3.

With such a configuration, the entering of moisture from the peripheral portion of the display device DSP to the circuit layer 40 and the resin layer RL can be suppressed by the first inorganic layer IL1, the second inorganic layer IL2 and the third inorganic layer IL3.

Figure 7:
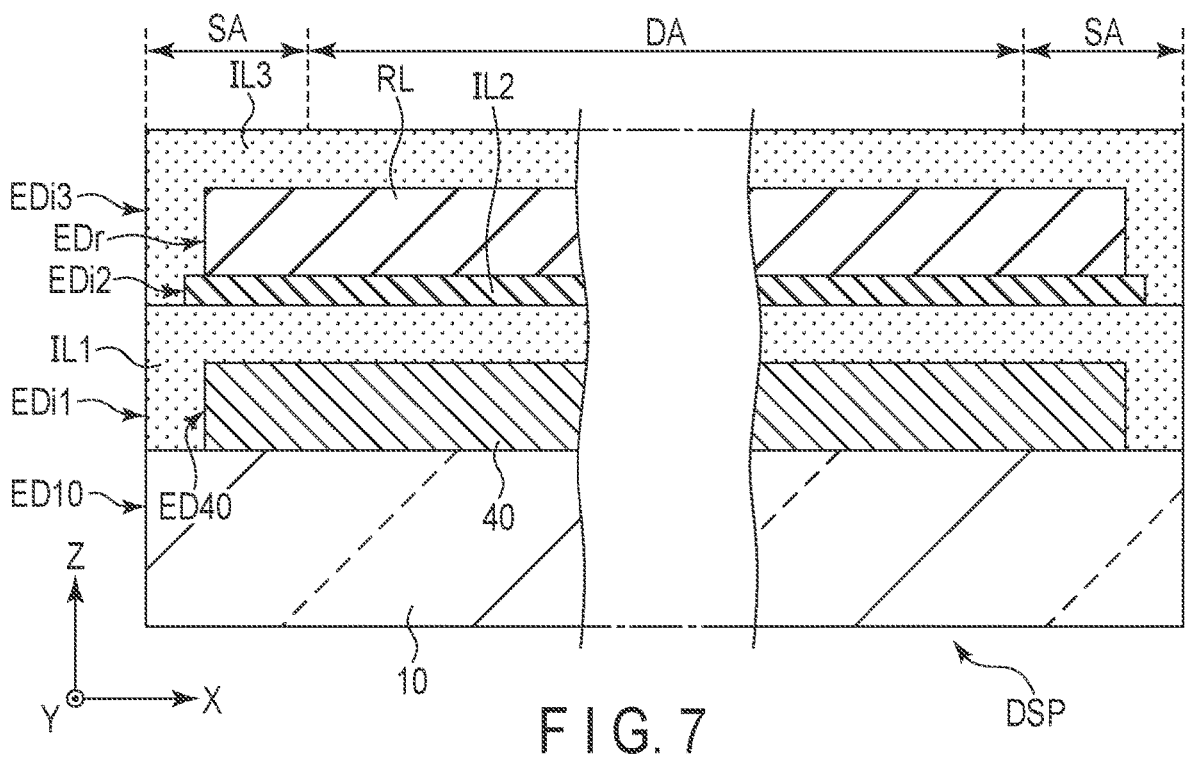
FIG. 7 is a cross-sectional view schematically showing another example that can be applied to the display device of the first embodiment.

FIG. 7 is a cross-sectional view schematically showing another example that can be applied to the display device DSP. In this example, the edge portion EDi2 of the second inorganic layer IL2 is located closer to the display area DA with respect to the edge portion EDi3 of the third inorganic layer IL3. The edge portion EDi2 is covered by the third inorganic layer IL3. The third inorganic layer IL3 is in contact with the first inorganic layer IL1 in the peripheral area SA. In the example of FIG. 7, the edge portions ED10, EDi1 and EDi3 are aligned with each other, but the edge portion ED10 may protrude beyond the edge portions EDi1 and EDi3. In other words, the edge portions EDi1 and EDi3 may be located between the edge portion ED10 and the edge portions EDi2, EDr and ED40 in the peripheral area SA.

For example, when the third inorganic layer IL3 is formed under deposition conditions and from materials similar to those of the first inorganic layer IL1, the third inorganic layer IL3 can exhibit higher adhesion to the first inorganic layer IL1 than to the second inorganic layer IL2. In such a case, when the third inorganic layer IL3 and the first inorganic layer IL1 are in contact in the peripheral area SA as shown in FIG. 7, the entering of moisture to the circuit layer 40 and the resin layer RL can be well suppressed.

Figure 8:
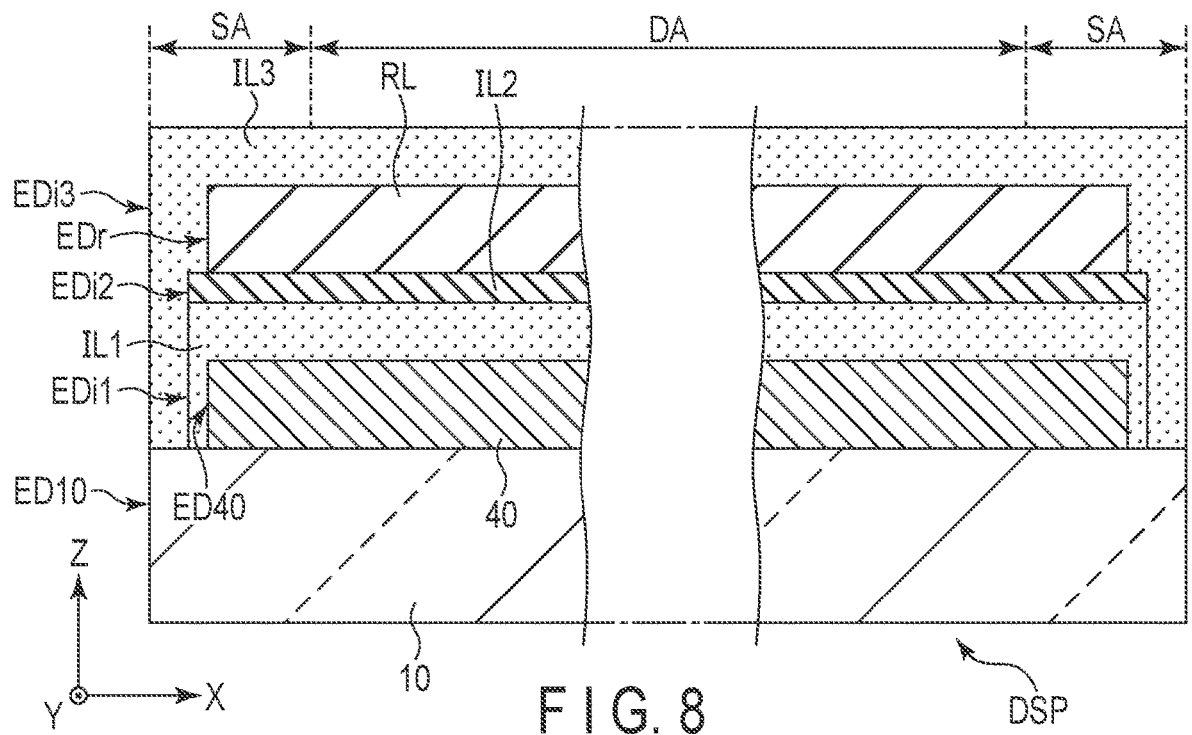
FIG. 8 is a cross-sectional view schematically showing still another example that can be applied to the display device of the first embodiment.

FIG. 8 is a cross-sectional view schematically showing still another example that can be applied to the display device DSP. In this example, the edge portion EDi1 of the first inorganic layer IL1 and the edge portion EDi2 of the second inorganic layer IL2 are located closer to the display area DA with respect to the edge portion EDi3 of the third inorganic layer IL3. The edge portions EDi1 and EDi2 are covered by the third inorganic layer IL3. The third inorganic layer IL3 is in contact with the base 10 in the peripheral area SA. In the example of FIG. 8, the edge portions ED10 and EDi3 are aligned with each other, but the edge portion ED10 may protrude beyond the edge portion EDi3. In other words, the edge portion EDi3 may be located between the edge portion ED10 and the edge portions EDi1, EDi2, EDr and ED40 in the peripheral area SA.

With a configuration such as shown in FIG. 8, the edge portion ED40 of the circuit layer 40 is doubly covered by the first inorganic layer IL1 and the third inorganic layer IL3. Further, in the peripheral portion of the display device DSP, the path of the moisture entering and migrating towards the circuit layer 40 is limited to the boundary between the base 10 and the third inorganic layer IL3. With this configuration, it is possible to well suppress the entering of moisture to the circuit layer 40.

Figure 9:
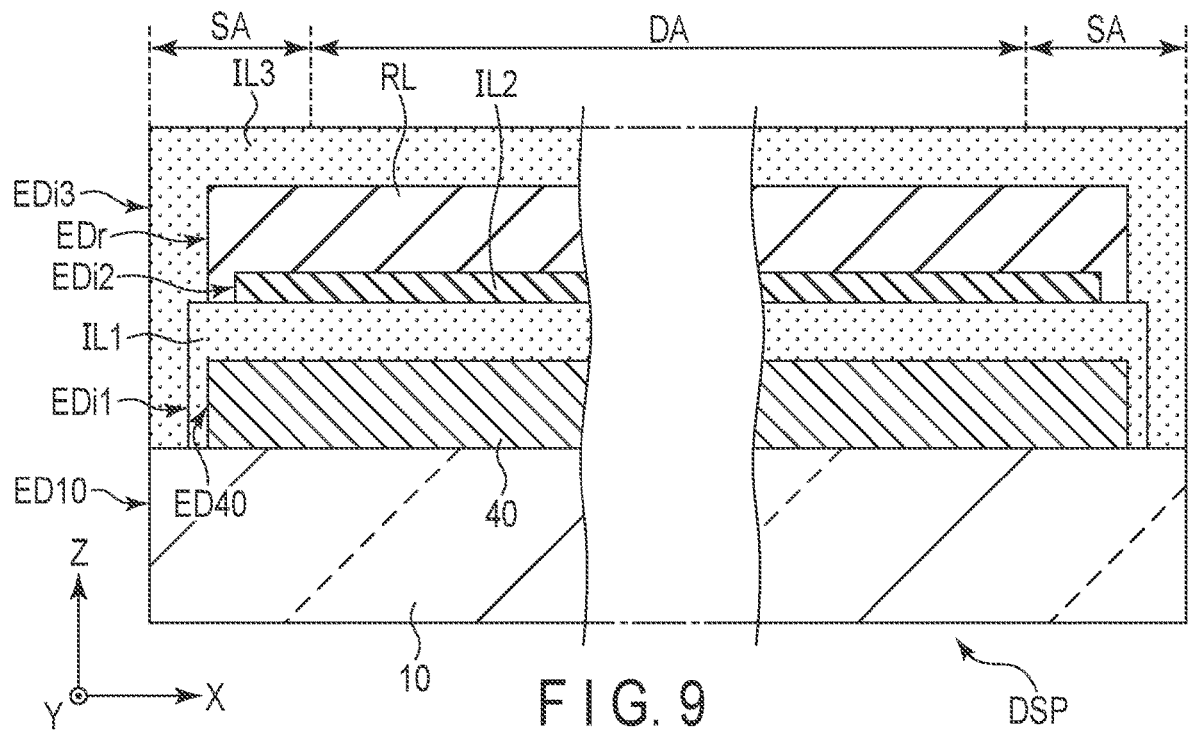
FIG. 9 is a cross-sectional view schematically showing still another example that can be applied to the display device of the first embodiment.

FIG. 9 is a cross-sectional view schematically showing still another example that can be applied to the display device DSP. In this example, the edge portion EDi2 of the second inorganic layer IL2 is located closer to the display area DA with respect to the edge portion EDr of the resin layer RL. The edge portion EDi2 is covered by the resin layer RL. The other configuration is similar to that of the example in FIG. 8. In the example of FIG. 9, the edge portions ED10 and EDi3 are aligned with each other, but the edge portion ED10 may protrude beyond the edge portion EDi3. In other words, the edge portion EDi3 may be located between the edge portion ED10 and the edge portions EDi1, EDi2, EDr and ED40 in the peripheral area SA.

FIGS. 6 to 9 each show the cross section of the display device DSP taken along the first direction X, and configurations similar to those shown in FIGS. 6 to 9 can be applied to the cross-section of the display device DSP taken along the second direction Y.

According to this embodiment described above, even if voids or seams are formed in the first inorganic layer IL1, it is still possible to avoid the entering of moisture through these voids or seams, and thus the display quality of the display device DSP can be improved.

Second Embodiment

The second embodiment will now be described. Note that the configurations not particularly referred to in this embodiment are similar to that of the first embodiment.

Figure 10:
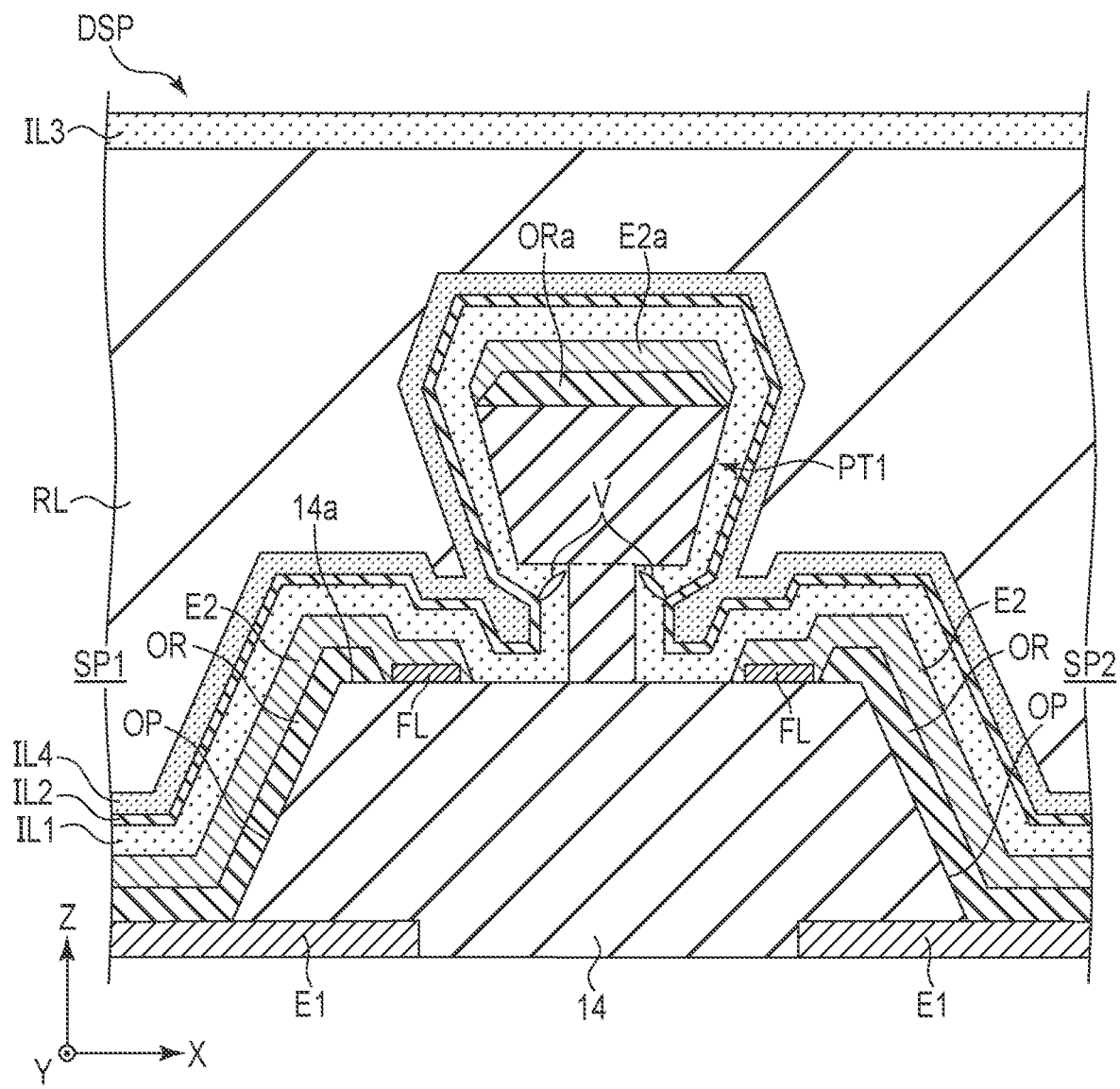
FIG. 10 is a partial cross-sectional view schematically showing a display device according to the second embodiment.

FIG. 10 is a schematic cross-sectional view of a part of the display device DSP of the second embodiment. FIG. 10, as in FIG. 5, shows an enlarged view of the vicinity of the partition wall PT1 located between the sub-pixels SP1 and SP2.

In this embodiment, the display device DSP further comprises a fourth inorganic layer IL4 located between the second inorganic layer IL2 and the resin layer RL. The fourth inorganic layer IL4 covers the second inorganic layer IL2 entirely. The resin layer RL covers the fourth inorganic layer IL4 entirely. The first inorganic layer IL1, the second inorganic layer IL2, the third inorganic layer IL3, the fourth inorganic layer IL4 and the resin layer RL constitute the sealing layer in this embodiment.

The fourth inorganic layer IL4 is formed, for example, of an inorganic material such as silicon oxide (SiOx), silicon nitride (SiNx), silicon oxynitride (SiONx), a metal, a metal oxide or the like. With the fourth inorganic layer IL4 provided in addition to the second inorganic layer IL2, it is possible to better suppress the entering of moisture penetration to the display element 20 through the void V or seams, which may be formed in the first inorganic layer IL1.

When the fourth inorganic layer IL4 is formed of the same material and under the same deposition conditions as those of the first inorganic layer IL1, voids and seams may be formed at the same locations in the first inorganic layer IL1 and the fourth inorganic layer IL4. Under these circumstances, in order to avoid this, the fourth inorganic layer IL4 should preferably be made of a material and under deposition conditions different from those of the first inorganic layer IL1.

For example, the fourth inorganic layer IL4 may be formed under the same deposition conditions as those of the second inorganic layer IL2, by which the wrap-in properties are excellent. Further, for example, the first inorganic layer IL1 may be formed of silicon oxide, silicon nitride or silicon oxynitride, and the fourth inorganic layer IL4 may be formed of a metal or metal oxide.

Figure 11:
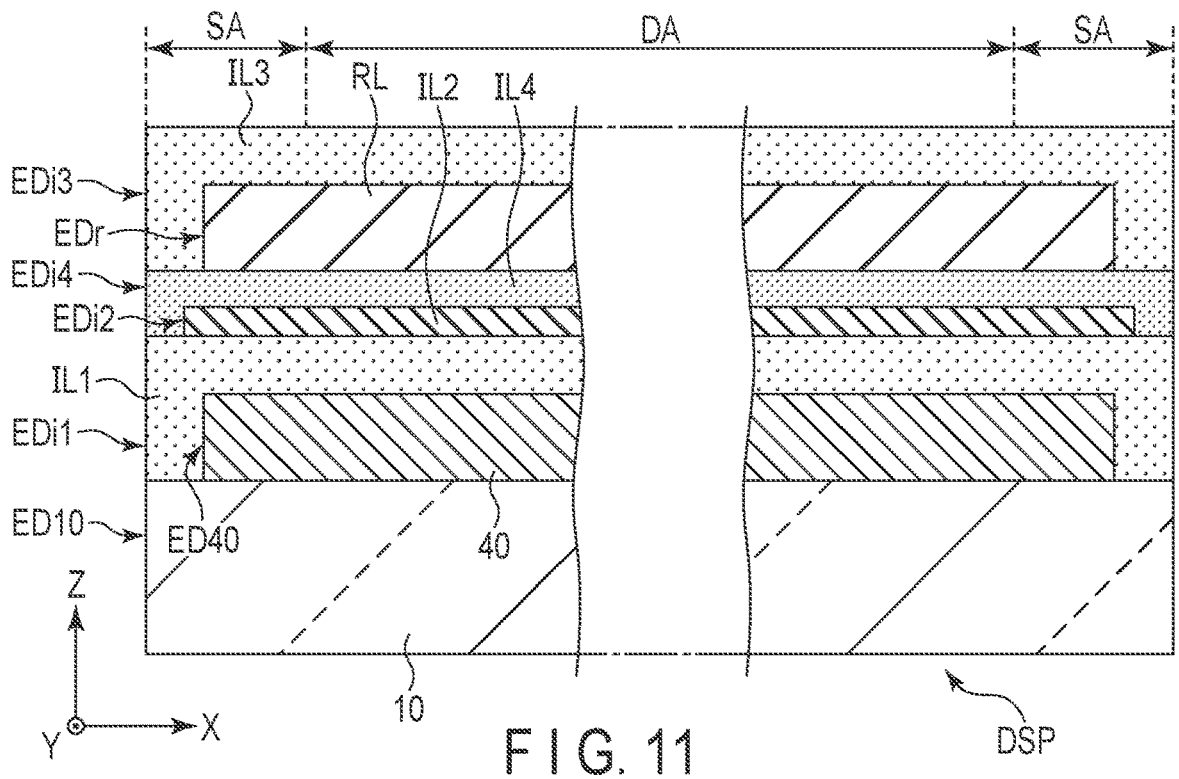
FIG. 11 is a cross-sectional view schematically showing the entire display device according to the second embodiment.

FIG. 11 is a cross-sectional view schematically showing the entire display device DSP of this embodiment. In this figure, as in FIG. 6, the insulating layers 11, 12 and 13, the ribs 14, the partition walls PT1 and PT2, the pixel circuit 1, the display element 20 and the like, disposed on the base 10 are illustrated in a simplified manner as a circuit layer 40.

The circuit layer 40, the first inorganic layer IL1, the second inorganic layer IL2, the third inorganic layer IL3, the fourth inorganic layer IL4 and the resin layer RL are formed over the entire display area DA and they are also formed to extend to the peripheral area SA. In other words, an edge portion ED40 of the circuit layer 40, an edge portion EDi1 of the first inorganic layer IL1, an edge portion EDi2 of the second inorganic layer IL2, an edge portion Edi3 of the third inorganic layer IL3, an edge portion Edi4 of the fourth inorganic layer IL4 and an edge portion EDr of the resin layer RL are all located in the peripheral area SA.

In the example of FIG. 11, the edge portions EDi1, EDi2 and Edi4 and the edge portion ED1 of the base 10 are aligned with each other. On the other hand, the edge portions ED40, EDr and EDi2 are located closer to the display area DA with respect to the edge portions EDi1, EDi3 and EDi4. The edge portion ED10 may protrude beyond the edge portions EDi1, EDi3 and EDi4. In other words, the edge portions EDi1, EDi3 and EDi4 may be located between the edge portion ED10 and the edge portions Edi2, EDr and ED40 in the peripheral area SA.

The first inorganic layer IL1 is in contact with the base 10 in the peripheral area SA. The third inorganic layer IL3 is in contact with the fourth inorganic layer IL4 in the peripheral area SA. The fourth inorganic layer IL4 is in contact with the first inorganic layer IL1 in the peripheral area SA. The edge portion ED40 of the circuit layer 40 is covered by the first inorganic layer IL1. The edge portion EDr of the resin layer RL is covered by the third inorganic layer IL3. The edge portion EDi2 of the second inorganic layer IL2 is covered by the fourth inorganic layer IL4.

With such a configuration that the fourth inorganic layer IL4 is in contact with the first inorganic layer IL1 and the third inorganic layer IL3 in the peripheral area SA, it is possible to excellently suppress the entering of moisture from the peripheral portion of the display device DSP toward the display area DA by these inorganic layers IL1, IL3 and IL4.

Figure 12:
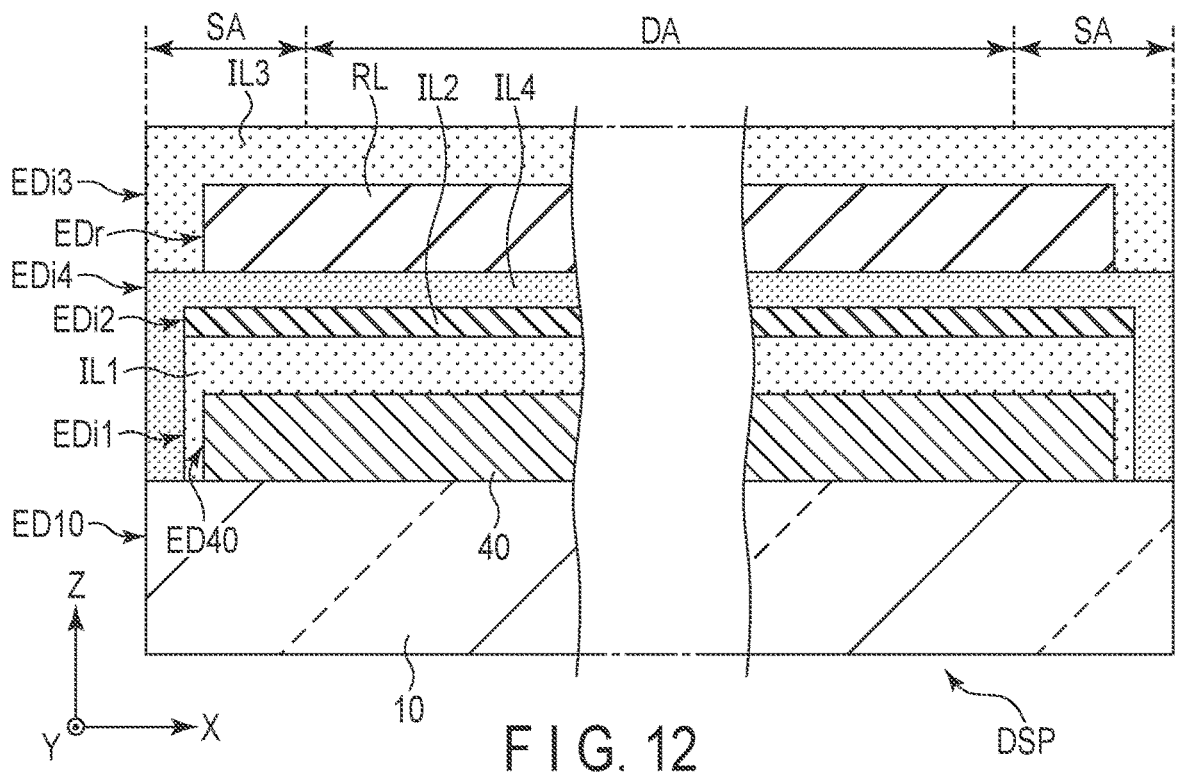
FIG. 12 is a cross-sectional view schematically showing another example that can be applied to the display device of the second embodiment.

FIG. 12 is a cross-sectional view schematically showing another example that can be applied to the display device DSP of this embodiment. In this example, the edge portion EDi1 of the first inorganic layer IL1 is located closer to the display area DA with respect to the edge portion EDi4 of the fourth inorganic layer IL4. The edge portion EDi1 is covered by the fourth inorganic layer IL4. The fourth inorganic layer IL4 is in contact with the base 10 in the peripheral area SA. In the example of FIG. 12, the edge portions ED10, EDi3 and EDi4 are aligned with each other, but the edge portion ED10 may protrude beyond the edge portions EDi3 and EDi4. In other words, the edge portions EDi3 and EDi4 may be located between the edge portion ED10 and the edge portions EDi1, EDi2, EDr and ED40 in the peripheral area SA.

With such a configuration as shown in FIG. 12, the edge portion ED40 of the circuit layer 40 are covered in double by the first inorganic layer IL1 and the fourth inorganic layer IL4. Thus, it is possible to excellently suppress the entering of moisture to the circuit layer 40.

Figure 13:
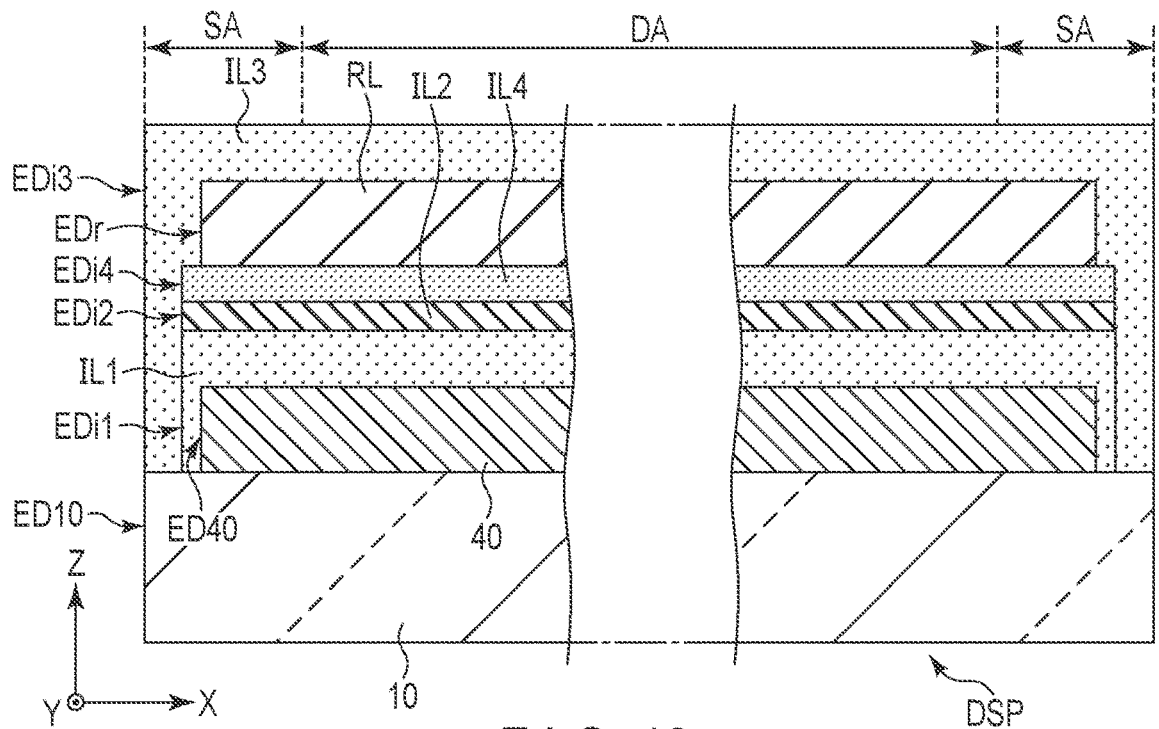
FIG. 13 is a cross-sectional view schematically showing still another example that can be applied to the display device of the second embodiment.

FIG. 13 is a cross-sectional view schematic showing still another example that can be applied to the display device DSP. In this example, the edge portion EDi1 of the first inorganic layer IL1, the edge portion EDi2 of the second inorganic layer IL2, the edge portion EDi4 of the fourth inorganic layer IL4 are all located closer to the display area DA with respect to the edge portion EDi3 of the third inorganic layer IL3. The edge portions EDi1, EDi2 and EDi4 are covered by the third inorganic layer IL3. In the example of FIG. 13, the edge portions ED10 and EDi3 are aligned with each other, but the edge portion ED10 may protrude beyond the edge portion EDi3. In other words, the edge portion EDi3 may be located between the edge portion ED10 and the edge portions EDi1, EDi2, EDi4, EDr and ED40.

With such a configuration as shown in FIG. 13, the path of the entering of moisture from the peripheral portion of the display device DSP towards the circuit layer 40 is limited to the boundary between the base 10 and the third inorganic layer IL3. Thus, it is possible to excellently suppress the entering of moisture to the circuit layer 40.

FIGS. 11 to 13 each show the cross section of the display device DSP taken along the first direction X, and configurations similar to those shown in FIGS. 11 to 13 can be applied to the cross-section of the display device DSP taken along the second direction Y.

Third Embodiment

The third embodiment will now be described. Note that the configurations not particularly referred to in this embodiment are similar to that of each of the above-provided embodiments.

Each of the above-provided embodiments provides a configuration example in which the partition walls PT1 and PT2 are disposed respectively on the boundaries between the sub-pixels SP1, SP2 and SP3, to separate the organic layer OR and the second electrode E2 from each other. In this embodiment, other configurations which separate the organic layer OR and the second electrode E2 are exemplified.

Figure 14:
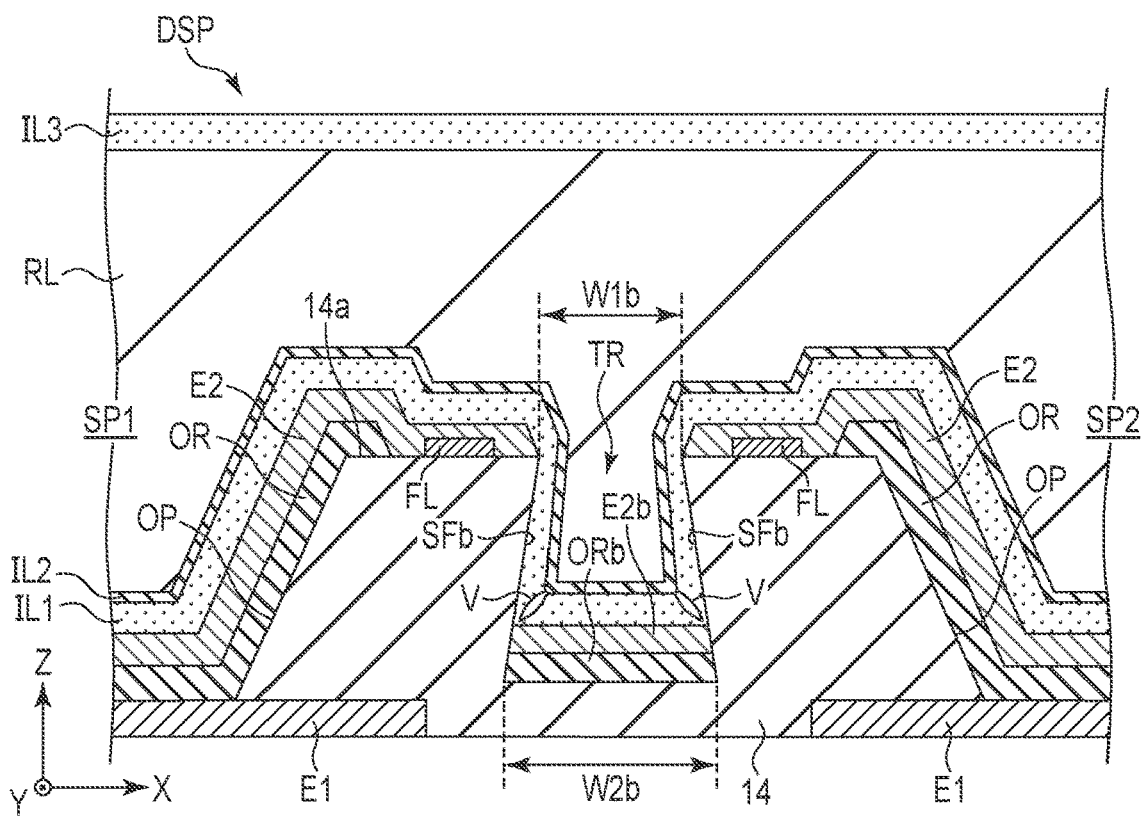
FIG. 14 is a partial cross-sectional view schematically showing a display device according to the third embodiment.

FIG. 14 is a cross-sectional view schematically showing a part of the display device DSP according to the third embodiment. FIG. 14 shows a configuration of the boundary between the sub-pixels SP1 and SP2. In this embodiment, the partition wall PT is not placed on the rib 14, but the rib 14 includes a trench TR. In the example in FIG. 14, the trench TR does not penetrate the rib 14, but the trench TR may penetrate the rib 14. In this case, the trench TR may extend into the layer below the rib 14 (that is, the insulating layer 13 shown in FIG. 3).

The trenches TR are formed into a lattice pattern as in the case of the partition walls PT (PT1, PT2) shown, for example, in FIG. 2. In the trench TR illustrated in FIG. 14, a width W1$b$ at the top is less than a width W2$b$ at the bottom. The width of the trench TR increases gradually downward. A pair of inner surfaces SFb of the trench TR are inclined along the third direction Z.

At the bottom of the trench TR, an organic layer ORb and a conductive layer E2$b$ which covers the organic layer ORb are disposed. The organic layer ORb is formed of the same material as that of the organic layer OR. The conductive layer E2$b$ is formed of the same material as that of the second electrode E2. The organic layer ORb is separated from the organic layer OR disposed in each of the sub-pixels SP1 and SP2. The conductive layer E2$b$ is separated from the second electrode E2 disposed in each of the sub-pixels SP1 and SP2.

The organic layer OR and the second electrode E2 are formed over the entire surface of the display area DA by vacuum evaporation, for example. At this time, when the material from the vapor deposition source adheres to the bottom of the trench TR, the organic layer ORb and the conductive layer E2$b$ are formed. On the other hand, material from the deposition source does not easily adhere to the pair of inner surfaces SFb of the trench TR. In the manner, the organic layer OR and the organic layer ORb are separated from each other, and the second electrode E2 and the conductive layer E2$b$ are separated from each other.

The second electrodes E2 of the sub-pixels SP1 and SP2, a pair of inner surfaces SFb of the trench TR and the conductive layer E2$b$ are continuously covered by the first inorganic layer IL1. The first inorganic layer IL1 is covered by the second inorganic layer IL2. The second inorganic layer IL2 is covered by the resin layer RL. The resin layer RL is covered by the third inorganic layer IL3.

In the configuration of this embodiment as well, voids and seams can be formed, for example, on an inner side of the trench TR. In the example of FIG. 14, a void V is formed in the vicinity of the lower edge portions of the pair of inner surfaces SFb.

Even if voids or seams are formed in the first inorganic layer IL1, these voids or seams are covered by the second inorganic layer IL2. Therefore, the entering of moisture through voids and seams can be suppressed in the same manner as in each of the embodiments described above.

FIG. 15 is a cross-sectional view schematically showing another example of the configuration that can be applied to the display device DSP of this embodiment. In the example of FIG. 15, the second inorganic layer IL2 is covered by the fourth inorganic layer IL4 as in the case of the second embodiment. With such a configuration, the entering of moisture through voids and seams which can be formed in the first inorganic layer IL1 can be even better suppressed.

Note that FIGS. 14 and 15 each show the configuration of the vicinity of the boundary between the sub-pixels SP1 and SP2, but a similar cross-sectional configuration can be applied to the vicinity of the boundary between the sub-pixels SP2 and SP3, the vicinity of the boundary between the sub-pixels SP1 and SP3, the vicinity of the boundary between each respective pair of sub-pixels SP1 aligned along the second direction Y, the vicinity of the boundary between each respective pair of sub-pixels SP2 aligned along the second direction Y, and the vicinity of the boundary between each respective pair of sub-pixels SP3 aligned along the second direction Y as well.

In the display device DSP shown in FIG. 14, to the lower configurations of the edge portions of the first inorganic layer IL1, the second inorganic layer IL2, the third inorganic layer IL3 and the resin layer RL, configurations similar to those shown in FIGS. 6 to 9 can be applied. Further, in the display device DSP shown in FIG. 15, to the lower configurations of the edge portions of the first inorganic layer IL1, the second inorganic layer IL2, the third inorganic layer IL3 and the resin layer RL, configurations similar to those shown in FIGS. 11 to 13 can be applied.

Based on the display device described above as embodiments of the present invention, a person having ordinary skill in the art may achieve a display device with an arbitral design change; however, as long as they fall within the scope and spirit of the present invention, all of such display devices are encompassed by the scope of the present invention.

A skilled person would conceive various changes and modifications of the present invention within the scope of the technical concept of the invention, and naturally, such changes and modifications are encompassed by the scope of the present invention. For example, if a skilled person adds/deletes/alters a structural element or design to/from/in the above-described embodiments, or adds/deletes/alters a step or a condition to/from/in the above-described embodiment, as long as they fall within the scope and spirit of the present invention, such addition, deletion, and altercation are encompassed by the scope of the present invention.

Furthermore, regarding the present embodiments, any advantage and effect those will be obvious from the description of the specification or arbitrarily conceived by a skilled person are naturally considered achievable by the present invention.

What is claimed is:

1. A display device comprising:
a base;
a plurality of display elements disposed above the base, each of the display elements comprising a first electrode, a second electrode opposing the first electrode and a light-emitting layer located between the first electrode and the second electrode;
a partition wall located between adjacent pair of the display elements;
a first inorganic layer formed of an inorganic material, which covers the display elements and the partition wall;
a second inorganic layer formed of an inorganic material, which covers the first inorganic layer;
a resin layer formed of a resin, which covers the second inorganic layer; and
a third inorganic layer formed of an inorganic material, which covers the resin layer.

2. The display device of claim 1, wherein
the second inorganic layer is thinner than the first inorganic layer.

3. The display device of claim 1, wherein
the partition wall includes:
a first portion having a first width; and
a second portion located below the first portion and having a second width that is less than the first width, and
the first inorganic layer covers the first portion and the second portion.

4. The display device of claim 1, further comprising:
a display area including the plurality of display elements; and
a peripheral area around the display area,
wherein
the first inorganic layer, the second inorganic layer, the third inorganic layer and the resin layer overlap at least the display area.

5. The display device of claim 4, wherein
in the peripheral area, the first inorganic layer and the third inorganic layer are in contact with each other.

6. The display device of claim 4, wherein
in the peripheral area, the third inorganic layer and the base are in contact with each other.

7. The display device of claim 4, wherein
in the peripheral area, the first inorganic layer and the base are in contact with each other.

8. The display device of claim 4, wherein
in the peripheral area, the second inorganic layer and the third inorganic layer are in contact with each other.

9. The display device of claim 4, further comprising:
a circuit layer disposed above the base,
wherein
in the peripheral area, an edge portion of the circuit layer is covered by the first inorganic layer.

10. The display device of claim 9, wherein
in the peripheral area, an edge portion of the first inorganic layer is covered by the third inorganic layer.

11. The display device of claim 4, wherein
in the peripheral area, an edge portion of the second inorganic layer is covered by the resin layer.

12. The display device of claim 1, further comprising:
a fourth inorganic layer formed of an inorganic material and located between the second inorganic layer and the resin layer.

13. The display device of claim 12, wherein
the fourth inorganic layer is formed of an inorganic material different from that of the first inorganic layer.

14. The display device of claim 12, further comprising:
a display area including the plurality of display elements; and
a peripheral area around the display area,
wherein
the first inorganic layer, the second inorganic layer, the third inorganic layer, the fourth inorganic layer and the resin layer overlap at least the display area.

15. The display device of claim 14, wherein
in the peripheral area, the first inorganic layer and the fourth inorganic layer are in contact with each other.

16. The display device of claim 14, wherein
in the peripheral area, the fourth inorganic layer is in contact with the base.

17. The display device of claim 16, wherein
in the peripheral area, an edge portion of the first inorganic layer is covered by the fourth inorganic layer.

18. The display device of claim 14, wherein
in the peripheral area, the third inorganic layer and the fourth inorganic layer are in contact with each other.

19. A display device comprising:
a base;
a plurality of display elements disposed above the base, each of the display elements comprising a first electrode, a second electrode opposing the first electrode and a light-emitting layer located between the first electrode and the second electrode;
a rib including a trench located between adjacent pair of the display elements;
a first inorganic layer formed of an inorganic material, which covers the display element and an inner surface of the trench,
a second inorganic layer formed of an inorganic material, which covers the first inorganic layer;
a resin layer formed of a resin, which covers the second inorganic layer, and
a third inorganic layer formed of an inorganic material, which covers the resin layer.

20. The display device of claim 19, further comprising:
a fourth inorganic layer formed of an inorganic material and located between the second inorganic layer and the resin layer.

* * * * *